United States Patent [19]

Cheng et al.

[11] Patent Number: 4,745,446
[45] Date of Patent: May 17, 1988

[54] PHOTODETECTOR AND AMPLIFIER INTEGRATION

[75] Inventors: Julian Cheng; Stephen R. Forrest, both of Chatham, N.J.

[73] Assignee: American Telephone and Telegraph Company, AT&T Bell Laboratories, Murray Hill, N.J.

[21] Appl. No.: 61,006

[22] Filed: Jun. 10, 1987

Related U.S. Application Data

[63] Continuation of Ser. No. 700,391, Feb. 11, 1985, abandoned.

[51] Int. Cl.$^4$ ............................................. H01L 29/80
[52] U.S. Cl. ...................................... 357/22; 357/16; 357/30; 357/56; 357/58; 357/69
[58] Field of Search ..................... 357/16, 22, 56, 58, 357/30, 69

[56] References Cited

U.S. PATENT DOCUMENTS

| 3,896,473 | 7/1975 | DiLorenzo et al. | 357/69 |
| 4,075,652 | 2/1978 | Umebachi et al. | 357/16 |
| 4,100,672 | 7/1978 | King et al. | 357/30 |
| 4,109,269 | 8/1978 | Hatch | 357/69 |
| 4,141,136 | 2/1979 | Henry et al. | 357/58 |
| 4,173,764 | 11/1979 | de Cremoux | 357/16 |
| 4,231,053 | 10/1980 | Schodlar | 357/16 |
| 4,236,165 | 11/1980 | Kawashima et al. | 357/16 |
| 4,297,720 | 10/1981 | Nishizawa et al. | 357/30 |
| 4,301,429 | 11/1981 | Goldman et al. | 357/58 |
| 4,490,735 | 12/1984 | Schwaderer | 357/56 |
| 4,496,788 | 1/1985 | Hamakawa et al. | 357/16 |
| 4,517,581 | 5/1985 | Thompson | 357/22 |
| 4,570,174 | 2/1986 | Huang et al. | 357/69 |
| 4,636,829 | 1/1987 | Greenwood et al. | 357/22 |

FOREIGN PATENT DOCUMENTS 53-52063  5/1978  Japan ..................... 357/69

OTHER PUBLICATIONS

"$In_{0.53}Ga_{0.47}As$ Submicrometer FET's Grown by MBE," Y. G.. Chai et al., IEEE Electron Device Letters, vol. EDL-4, No. 7, Jul. 1983, pp. 252–254.
"A Self-Aligned $In_{0.53}Ga_{0.47}As$ Junction Field-Effect Transistor Grown by Molecular Beam Epitaxy," D. Wake et al., IEEE Electron Device Letters, vol. EDL-5, No. 7, Jul. 1984, pp. 285–287.

Primary Examiner—Joseph E. Clawson, Jr.
Attorney, Agent, or Firm—Walter G. Nilsen

[57] ABSTRACT

Various integrated device structures are described which incorporate novel substrate materials and channel confinement schemes. For example, devices are described for p-type substrates and novel buffer layers. Such substrates are easier to grow and provide good isolation and low-trap density at the interface between substrate and buffer layer.

25 Claims, 4 Drawing Sheets

U.S. Patent May 17, 1988 Sheet 3 of 4 4,745,446

PHOTODETECTOR AND AMPLIFIER INTEGRATION

This application is a continuation of application Ser. No. 700,391, filed Feb. 11, 1985, now abandoned.

TECHNICAL FIELD

The invention relates to semiconductor circuits, in particular, semiconductor circuits comprising various substrate structures.

BACKGROUND OF THE INVENTION

The demands of both communication technology and computer technology has led to greater requirements in the field of III-V integrated circuit technology. These requirements include greater speed, more sensitivity, higher gain, greater packing density and closer tolerances for circuit elements.

Particularly important in the fabrication of III-V integrated circuits is the nature of the substrate material. Particularly significant is the resistivity of the substrate so as to effect isolation of various elements of the integrated circuit and the trap density at the interface between substrate and circuit. High trap density can lead to hysteresis affects in the current vs voltage characteristics of the integrated circuits which effects certain desirable characteristics of the circuit such as noise performance and circuit stability.

Conventional integrated circuits using field-effect transistor (FET) elements or junction field effect transistor (JFET) elements generally use semi-insulating indium phosphide substrates to obtain electrical isolation between circuit components. Such circuits are discussed in a number of references including D. Wake et al, *IEEE Electron Device Letters*, Vol. EDL-5, No. 7 (July 1984) and Y. G. Chai et al, *IEEE Electron Device Letters*, Vol. EDL-4, No. 7 (July 1983). Although these circuits employing semi-insulating indium phosphide substrates work, circuits with substantially lower defect density between substrate and circuit elements are highly desirable. Also, in III-V semiconductor circuits employing multiple FET elements or FET elements incorporated with other device elements such as photodetector elements or diode elements, semi-insulating substrates often limit flexibility, ease of integration or advantageous integration geometries.

SUMMARY OF THE INVENTION

The invention is a device comprising one or more III-V semiconductor integrated circuits in which the substrate comprises highly doped indium phosphide (either n-type or p-type) with the surface contacting the integrated III-V semiconductor circuit made of p-type III-V semiconductor compound. A number of specific substrate configurations are included in the invention. One substrate configuration is entirely composed of P+InP. A typical dopant for such a substrate material is zinc (although Cd, Mg, and Be may be useful) in the concentration range from $2-40 \times 10^{17}$ atoms/cm$^3$. Another substrate configuration is a slab of N+InP covered with a p-type epitaxial layer. The p-type epitaxial layer contacts the integrated III-V semiconductor circuit. Typically, the N+Inp slab is doped with S or Sn (although Si and Te may be useful) in the concentration range from about $2-40 \times 10^{17}$ atoms/cm$^3$. The p-type epitaxial layer may be any III-V semiconductor layer which is compatible with the N+InP surface, generally a III-V semiconductor compound that is lattice-matched to N+InP. Typical examples are P+InGaAs with composition that is lattice-matched to InP (approximate composition In$_{0.53}$Ga$_{0.47}$As) and P+InP. A typical dopant for the P+InGaAs and P+InP epitaxial layers is Be in the concentration range $2-60 \times 10^{17}$ atoms/cm$^3$. Such substrate structures are highly advantageous because of the low defect density at the interface between substrate and integrated circuit structure. Typical integrated circuit structures incorporate amplifier structures (field-effect transistor structures), particularly junction field-effect transistors (JFETS). Generally, the integrated structures are a multiplicity of JFETS or JFETS integrated with other circuit elements, often optical circuit elements such as photodetectors (e.g., PINFETS). Such circuits have higher frequency response, lower noise characteristics and are simpler to fabricate reliably with higher yields. Another advantage is the possible use of a back gate electrode which is used to electrically control the gain of the JFET.

DETAILED DESCRIPTION

The invention is based on the discovery that various novel substrate structures are useful for III-V semiconductor devices, that these novel substrate structures use a p-type material to provide the surface on which the active elements of the device are formed. This surface of p-type material is often used as a channel confinement surface or layer in a field-effect type device. Possible applications are amplifier, logic or memory circuits using FET or JFET elements including integrated circuits and integrated optical-electronic circuits.

Figure 1:
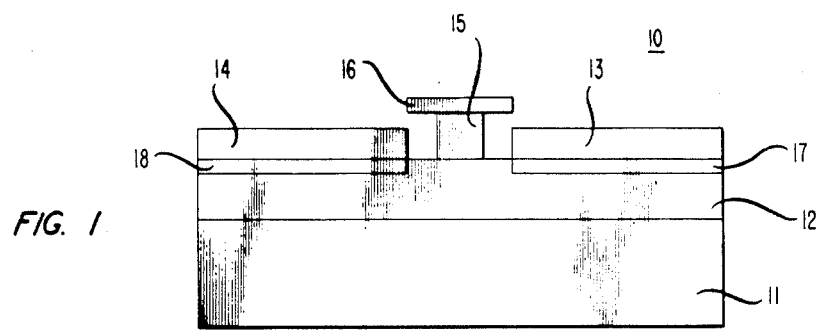
FIG. 1 shows a side view of a JFET structure with substrate made of p-type III-V semiconductor material.

The invention is best illustrated by a description of a single junction field-effect transistor. A side view of such a structure is shown in FIG. 1. This is a particular type of JFET and is used to illustrate the use of a p-type substrate or p-layer as a channel confinement layer in a FET or JFET structure.

The JFET structure 10 is made up of a substrate of P+InP 11 topped with a layer 12 of n-type, lattice-matched, indium gallium arsenide. The substrate serves as the channel confinement layer 11 and the n-type indium gallium arsenide serves as the channel layer 12. On top of this channel layer is the drain electrode 13 and source electrode 14 usually made of gold-germanium, gold-silicon, or gold-tin and usually heat-treated to make the contact ohmic. Between the source and drain is a small post of p-type semiconductor 15 which, together with the n-type channel layer 12, forms the p-n junction of the structure. For convenience, this p-layer is called the gate p-layer. The gate electrode typically overhangs the post by about 0.1 to 1.0 μm. It is generally made of alloys of gold, such as palladium-gold or zinc-gold, or nonalloy materials such as chromium-gold, although other electrode materials might be used.

Particularly desirable is a short post of p-type material. Typically, the length of the post is less than 5 μm or even 2 μm or 1 μm.

An essential feature of this structure is the overhang of the gate electrode 16 over the post of p-type material (the gate p-layer) 15. It is this overhang of the gate electrode over the post of p-type material that permits close alignment of the source and drain electrodes. to the p-n junction without any special realignment procedure. Here, the gate electrode acts as a shadow mask in the deposition of the drain and source electrodes. The amount of overhang is controlled by undercutting in the etch process that removes most of the p-layer. The source and drain electrodes are generally made by evaporation and the amount of overhang on the gate electrode determines how close the source and drain electrodes are to the p-n junction. Implantation prior to metal evaporation may be used to make suitable source and drain electrodes. For example, contact resistance can be reduced by ion implantation on the surface where the electrode is to be formed (e.g., on the surface of layers 17 and 18). Various alloys or mixtures of metals may be used for the same purpose.

Figure 2:
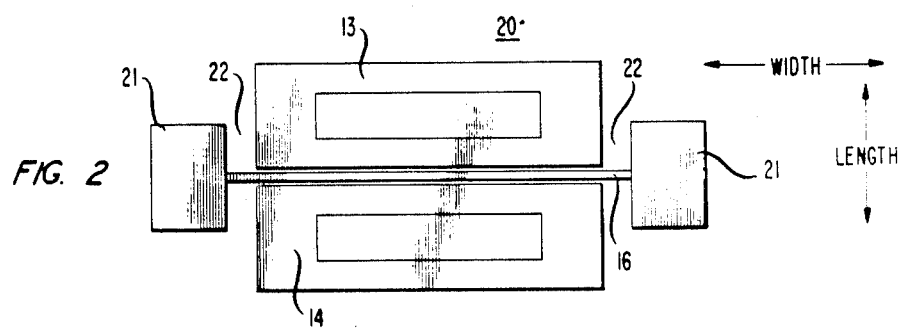
FIG. 2 shows a perspective view of the JFET structure of FIG. 1.

FIG. 2 shows a top view 20 of the same structure with drain electrode 13, source electrode 14 and gate electrode 16. Also shown are the gate pads 21 and part of the gate electrode where the air bridge is located 22.

A note on nomenclature might be of use at this point. The dimension of the gate electrode in the plane of the channel layer pointing toward source and drain electrodes is called the length of the gate even though this is usually the short dimension of the gate electrode. The direction perpendicular to the length, usually extending between source and drain electrodes is called the width of the gate although this is often the long dimension of the gate electrode. The direction in which the width and length of the gate electrode are measured is shown in FIG. 2. It is preferred that these devices are oriented relative to the crystal planes of the semiconductor materials in certain ways; namely, that the surface on which the epitaxial layers and devices are deposited (the plane of the paper in FIG. 2) be a [100] crystal plane and the gate width be along a <110> crystallographic direction.

It should be recognized that the above-described structure can be made with a large variety of semiconductor materials as the channel layer and gate p-layer (post 15 in FIG. 1). For example, the n-type and p-type materials may be the same or different.

Preferred are semiconductor material systems which have high carrier mobilities and saturation velocities, or materials related (generally by lattice-matching) to such materials. Included in these materials are indium phosphide, indium gallium arsenide (generally with approximate composition $In_{0.53}Ga_{0.47}As$ that is lattice-matched to indium phosphide) aluminum indium arsenide (e.g., $Al_{0.48}In_{0.52}As$) and quaternary compounds such as indium gallium arsenide phosphide and indium gallium aluminum arsenide with compositions that are lattice matched to indium phosphide.

Such compositions are outlined in a book by H. C. Casey, Jr. and M. B. Panish entitled *Heterostructure Lasers*, Academic Press, New York, 1978, particularly Part B: "Materials and Operating Characteristics."

Most convenient is the use of $In_{0.53}Ga_{0.47}As$ as the n-type material and InP or $In_{0.53}Ga_{0.47}As$ as the p-type material.

It is convenient here to outline the various preferred dopants used for the p-type layers and n-type layers and the preferred concentrations of these dopants. It should be realized that these are typical dopants and typical concentration ranges and the invention may be practiced with other dopants and other dopant concentration ranges. Also, dopant concentration may vary through the thickness of the various layers and may be made unusually high near the various electrodes to improve electrical contact characteristics. Typical n-type dopants are Sn, Si, S and Te with typical concentration ranges between $10^{16}$ and $10^{17}$ atoms/cc. For InP and InAlAs, most preferred is in the range from $8–9\times10^{16}$ atoms/cc, for InGaAs, $4–7\times10^{16}$ atoms/cc and for InGaAsP $6–8\times10^{16}$ atoms/cc. For the p-type layer, typical dopants are Cd, Zn, Mg and Be with doping concentration ranges between $10^{18}–10^{19}$ atoms/cc. Near the gate electrode, the doping concentration may exceed this range (often approaching $10^{20}$ atoms/cm$^2$) so as to obtain low resistance, ohmic contact between electrode and p-layer.

The thickness of the n-layer and p-layer may vary over large limits depending on desired application. Thicknesses of a few μm may be useful. Usually, thicknesses of less than 1 μm are preferred. The thickness of the n-layer generally depends on the material, doping concentration, desired characteristics of the device, etc., but usually is in the range from 0.1 to 0.7 μm. The thickness of the p-layer is also usually less than 1 μm. Often, thickness of the p-layer is close to the desired undercut under the gate electrode, often approximately 0.5 μm.

The important aspect of the invention is the use of P+InP as the substrate. This also serves as the channel confinement layer against which the conduction electrons are pinched-off during operation. The advantage of such a structure is the low defect density at the interface between substrate and channel layer which results in a low defect density not only at this interface but throughout the channel and gate p-layers.

Figure 3:
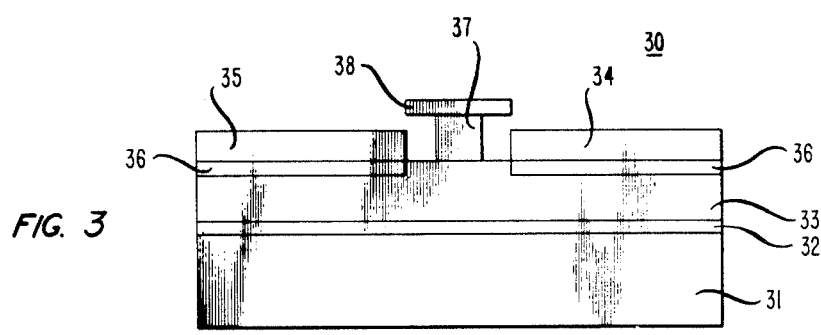
FIG. 3 shows a side view of a JFET structure much like the one shown in FIGS. 1 and 2 but with a different substrate structure.

Another substrate structure is shown in FIG. 3. This Figure shows a side view of a JFET structure 30 much like the one shown in FIGS. 1 and 2. The substrate here is made up of a relatively thick layer of N+InP 31 (could also be P+InP) generally grown as a bulk material. This layer is topped with an epitaxial layer 32 of p-type material approximately lattice-matched (or at least suitably grown on) the N+InP 31. Typical layers are P+InGaAs (e.g., $In_{0.53}Ga_{0.47}As$ doped with Be in the range from $2–40\times10^{17}$ atoms/cm$^3$) and P+InP again doped as above.

The rest of the structure is much as shown in FIG. 1. On top of the P+-type epitaxial layer 32 is the channel layer 33, typically n-InGaAs or n-InP. Part of the channel layer is covered with n-type contacts, one the drain electrode 34 and one the source electrode 35. These electrodes are generally made of gold-germanium, gold-silicon or gold-tin and are heat treated so that some n-type dopant diffuses into the channel layer to produce a narrow area 36 of highly doped (n+) surface. This produces excellent ohmic contacts. Ion implantation may also be used to produce a highly doped surface region 36. Also shown is the gate p-layer 37, and the gate electrode 38.

More complex structures are also of use in the practice of the invention. For example, large arrays of JFET structures made as above are useful for various applications including logic circuits, memory circuits, etc.

The invention is further illustrated by more complex structures; for example, where optical and electronic structures are integrated on the same substrate structure. Specifically, an integrated photodetector-amplifier structure is described showing a PIN photodetector and JFET amplifier. This structure is commonly referred to as a PINFET.

Figure 4:
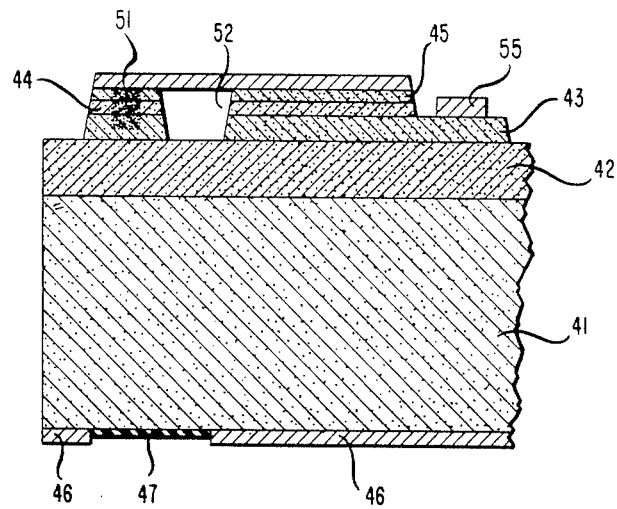
FIG. 4 shows a side view of a PINFET structure with substrate structure in accordance with the invention.

The general structure of the PINFET is most easily seen with a side view of the structure. This side view of the PINFET clearly shows the epitaxial layer structure, the p-diffusion region and air bridge from the p-contact on the PIN photodetector structure to the gate electrode of the JFET structure. FIG. 4 shows a side view of the PINFET cut through the PIN-photodetector part and the gate of the field-effect transistor. The PINFET 40 is made up of layers of III-V semiconductor compounds beginning with a substrate 41 of N+-InP generally doped in the range from $1-5 \times 10^{18}$ atoms/cm$^2$ with tin or sulfur. This layer is generally about 150 μm thick. On top of this layer is an intrinsic layer 42 of InGaAs (approximate composition In$_{0.53}$Ga$_{0.47}$As) lattice-matched to InP. This layer generally has impurities which make it lightly doped n-type with approximate concentration of $5 \times 10^{14}$ atoms/cc. The thickness of this layer is about 5 μm. The bandgap of this layer (0.75 eV) is such to ensure absorption of the incident radiation (radiation with energy greater than 0.75 eV or wavelength shorter than 1.65 μm) in the layer and the doping level is low (ideally as low as possible) to ensure extension of the electric field gradient throughout the layer.

On top of this layer 42 is a thin layer 43 of p-type semiconductor material lattice-matched to (or at least compatible with) the InP system. This layer is called the channel confinement layer. Often, a large bandgap material (e.g., P-InP, bandgap 1.35 eV or P-InAlAs, bandgap 1.4 eV) is preferred to avoid voltage breakdown, but other materials might be advantageous particularly where compatibility with the layer below 42 and above 44 makes fabrication easier. For example, when the absorption layer 42 and channel layer 44 are InGaAs, P-InGaAs might be preferred. Above the channel confinement layer are two more III-V semiconductor layers used to form the n and p layers of the JFET. These layers are n-type InGaAs 44 (lattice-matched to InP) and p-type InGaAs 45 (lattice-matched to InP). Other materials (principally InP or InGaAsP) may be used for these layers. Typical thicknesses are 0.4 μm for the n-InGaAs and 0.6 μm for the P-InGaAs. These layers are loosely referred to as the n-type JFET layer or channel layer and the p-type JFET layer or gate p-layer. These layers will be discussed in more detail below.

Various metallizations are also part of the PINFET structure. For example, attached to the N+-InP is an n-type contact 46 (typically Au-Sn) with an opening to admit radiation. The N+-InP 41 surface exposed by the opening in the n-type contact 46 is covered usually with an anti-reflection (AR) coating 47 to reduce reflections at the surface.

Also shown are some p-contacts generally made of Cr-Au alloy. For example, such an alloy forms the p-contact 48 for the PIN part of the structure and the p-contact 49 for the JFET gate electrode. The same metallization forms the air bridge 50 connecting the PIN part of the circuit to the gate 49 of the JFET. Contact to the back gate is made via contact 55, typically of the same metal composition as the gate electrode 49.

Also shown is the P+-type region 51 which forms the P region of the PIN structure. This is generally introduced by diffusing zinc into the top two layers (44, 45) prior to putting down the p-contact of the PIN structure. Doping concentration is usually in the range $10^{18}$-$10^{19}$ atoms/cm$^3$. Various passivating layers may also be used (e.g., SiN$_x$) but are not shown. Because the section shown goes down the center of the gate electrode, the source and drain electrodes are not shown in FIG. 4.

Because of the use of a p-layer as the channel confinement layer, another variation is possible in producing the PIN junction. Here, instead of a P+-type region 51, the p-contact of the PIN structure is made to contact the channel confinement layer 43 directly. This is done by etching or removing a small portion of the channel layer 44 and p-layer 45 located under the p-contact region of the PIN structure; then the p-contact will contact the channel confinement layer 43 to form the PIN junction.

Two important features of the invention are worthy of emphasis; namely, the air bridge 50 which isolates the PIN electrode from the gate electrode of the JFET and the mesa isolation trenches 52 which surround the PIN structure and isolate it from the JFET structure. Also advantageous is the use of a p-layer as the channel confinement layer which permits the use of better semiconductor material with lower defect density at various interfaces.

Figure 5:
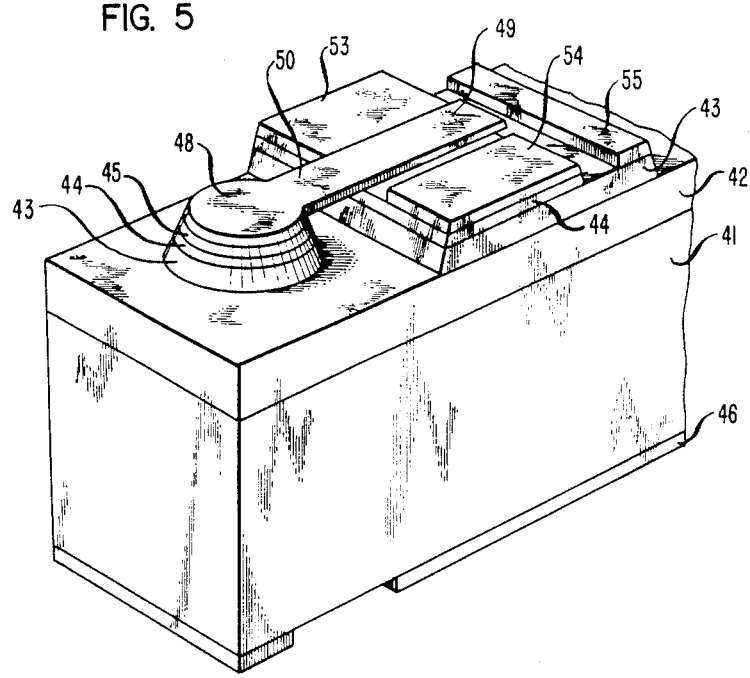
FIG. 5 shows a perspective view of the PINFET structure shown in FIG. 4.

FIG. 5 shows a perspective view of the same structure made with the p-contact 48 on the PIN photodetector, the air bridge 50 and the gate electrode 49 of the JFET structure. Also shown are the p-type InGaAs 45 and n-type InGaAs layer 44 which is present both in the PIN part of the structure and the JFET part of the structure. The p-type InGaAs in the JFET part of the structure is under the gate electrode. These layers are removed between the PIN and JFET parts of the structure (under the air bridge 50) so as to provide electrical isolation between photodetector and amplifier parts of the structure. The channel confinement layer 43 is found below these layers, again to electrically isolate the PIN part of the structure from the JFET part of the structure and to serve as the channel confinement layer in the JFET structure. Next is the absorption layer 42 typically made of InGaAs lattice-matched to InP and the N+-InP structure 41. An n-type contact layer 46 serves as one of the electrical contacts to the structure. A p-contact layer 49 is shown on top of the structure.

Also present but only shown in FIG. 4 is the P-type region 51 which extends through the JFET layers 44, 45 and to the confinement layer 43. This forms the p-n junction of the photodetector and provides conduction to the p-contact 48 of the PIN photodetector. As mentioned above, another way of contacting a p-region for the PIN junction is to cut a hole in the p and n layers 44 and 45 and deposit the p-contact onto the channel confinement layer 43. This avoids producing the p-region 51.

Also shown in this Figure is the drain electrode 53 and the source electrode 54 and back gate electrode 56. Again, the drain and source electrodes are deposited so that the overhang of the gate electrode acts as a shadow mask and permits close approach of these electrodes to the P-InGaAs post without actual electrical contact.

Figure 6:
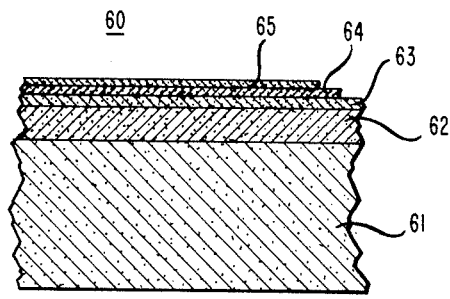
FIG. 6 shows a layered structure from which a PINFET device is fabricated.

A particular advantage of the inventive structure is the ease of fabricating the structure in such a way as to obtain optimum operation. A convenient point to begin a description of the fabrication procedure is at the layered structure 60 as shown in FIG. 6. This structure is made by various epitaxial layer growth techniques starting with an N+-InP substrate.

The structure 60 consists of an N+-InP substrate 61 doped with sulfur or tin in the range from $1-5\times10^{18}$atoms/cm$^3$. This layer 61 is eventually thinned down to a thickness of 150 $\mu$m generally later in the fabrication procedure. On top of the substrate is an undoped layer 62 of InGaAs with a thickness of approximately 5 $\mu$m. This layer has approximate composition $In_{0.53}Ga_{0.47}As$ so that it is approximately lattice-matched to InP. Impurities generally make this layer n-type with a doping concentration generally in the range of $1-30\times10^{14}$atoms/cm$^3$. Next is found a channel confinement layer 63 usually made of p-type InP or p-type InAlAs. Also used is p-type InGaAs, lattice-matched to the InP. This type layer is especially useful where InGaAs is used for one or more adjacent layers. The thickness of the layer 63 is approximately 1 $\mu$m. Next comes the two JFET layers: first a layer 64 of n-type InGaAs generally doped with silicon in the concentration range of $4-8\times10^{16}$atoms/cm$^3$. The thickness of this layer 64, often called the channel layer, is generally between 0.3 and 0.5 $\mu$m.

The other JFET layer is a P-InGaAs layer 65 and is typically doped with Be. Often the doping concentration is different in different parts of the P-InGaAs layer. For most of the thickness of the P-InGaAs layer (typically 0.5 to 0.6 $\mu$m) including at the interface with the n-InGaAs layer, the doping concentration is about $1-5\times10^{18}$atoms/cm$^3$; for a thin layer on top of the p-layer adjacent the p-contact (typically 500 Angstroms), the doping concentration is about $1-2\times10^{19}$atoms/cm$^3$. An exemplary process for fabricating this structure is as follows: first, the structure shown in FIG. 6 is oriented so that a <110> direction in the [100] wafer is directed so that the long dimension of the gate (gate width) lies along this direction.

A p-diffusion procedure is carried out to form the p-n junction of the PIN structure. A SiN layer is deposited on the P-InGaAs. This is patterned to serve as a diffusion mask to define the active PIN area 21 in FIG. 2. The zinc vapor diffusion is carried out so that the diffusion depth just penetrates the upper portion of the p-type InGaAs layer 12 in FIG. 1. After the diffusion, the SiN mask is removed.

Then the p-contact metal patterns (including the PIN contact and gate contacts of the various FET) are defined photolithographically using Cr-Au or other suitable p-contact metals.

These metal contacts are made so they can serve as shadow masks when the source and drain of the JFETS are formed.

A critical part of the fabrication procedure is removal of the p-layer (including some undercutting of the gate electrode) without substantially affecting the n-layer or substrate. Generally, the exact procedure depends on the nature of the III-V semiconductor material in the n-layer and p-layer.

Particularly important in the practice of the invention is obtaining a suitable shape for the post p-type material so that the gate electrode acts as an effective shadow mask and the evaporated source and the P-InGaAs layer is etched away using a 50 volume percent solution of citric acid with aqueous hydrogen peroxide and an electrical monitoring system to measure the progress in the etching process. The current-voltage characteristics of two adjacent gate electrodes are measured and the etch stopped when the resistive characteristics disappear and only back-to-back diode characteristics remain. This indicates removal of the p-layer between adjacent gate electrodes with only the p-n junction under each gate electrode remaining. Removal of the p-layer also results in undercutting under the gate electrode by a distance approximately equal to the original thickness of the p-layer. The overhang of the gate electrode over the p-layer post ensures self-alignment of the source and drain electrodes deposited later.

The n-contact metallization of source and drains of the JFET is put down by standard photolithographic techniques using typically Ge-Au. This is a self-aligned process because of the overhang on the undercut gate. This yields very close spacings between drain and source contacts (typically 2 $\mu$m) without the danger of contact with the p-layer.

Next, mesa isolation is carried out by covering the JFET structure and etching away the n-InGaAs and the P-InGaAs layers including the bridge region. Typical etchant is 50 volume percent citric acid with aqueous hydrogen peroxide. At this point, the substrate (N+-InP) may be thinned to 150 $\mu$m.

On back side of the substrate (N+-InP), an n-contact is put down except for openings directly underneath the active PIN areas to allow admittance of incident light.

A number of variations may be used in the practice of the invention. For example, other III-V semiconductor materials may be used for the two JFET layers provided they are lattice-matched to the InP substrate (or material lattice-matched to other substrate materials). The device described above and in FIGS. 1, 2 and 3 uses lattice-matched InGaAs (approximate composition $In_{0.53}Ga_{0.47}As$). Other materials that could be substituted for InGaAs at either the n-layer or p-layer are as follows: InGaAsP lattice-matched to InP, InP, other ternary or quaternary III-V compounds that can be lattice-matched to InP.

Typical combinations and etching systems are as follows:

1. Both p-layer and n-layers are InP. Typical etches are hydrochloric-phosphoric acid (typically in the volume ratio of 1:4 using concentrated hydrochloric acid) sometimes with small amounts of hydrogen peroxide added, or alternatively bromine-methanol (usually dilute solution). The same monitoring technique can be used as described above;

2. P-layer InGaAs (or InGaAsP) lattice-matched to InP and n-layer InP. A typical etch is citric acid—with or without aqueous hydrogen peroxide mentioned above. The etch will remove the p-layer and stop at the n-type InP. The etch rate is about 800-1200 Angstroms/minute. The same monitoring procedure as described above can be used to observe the progress of the etching process. However, since the etch rate greatly decreases on reaching the InP, this technique is largely self-stopping and thus electrical monitoring is not essential; and 3. P-layer is InP and n-layer is InGaAs or InGaAsP lattice-matched to InP. A typical etch is hydrochloric acid in phosphoric acid (composition described above) which etches InP but not InGaAs or InGaAsP. Again, the etching process can be monitored as described above, although, once again this is not essential to successful processing. Typical etch rate of InP using this etchant is 3000–6000 Angstroms/minute.

Figure 7:
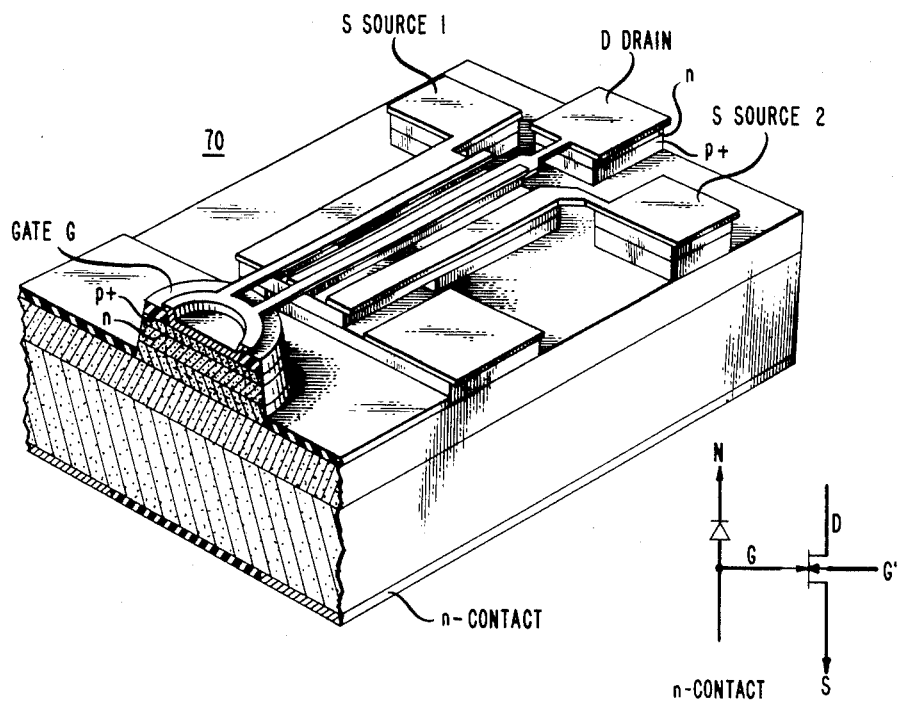
FIG. 7 shows a PINFET structure with double gate and back gate.

FIG. 7 shows another PINFET structure 70 illustrating another variation of the invention using a p-layer as the channel confinement layer. This structure features a double gate structure, to reduce the long dimension (width) of the gate electrode and reduce stray capacitance of the drain and a back gate electrode to vary the gain of the device. Notice, a back gate electrode is only possible if a p-layer is used as the channel confinement layer. A circuit diagram of the device is also shown. Here, G is the gate and G' the back gate; N, the n-contact; S, the source (with source 1 and source 2 usually connected together) and D, the drain.

Figure 8:
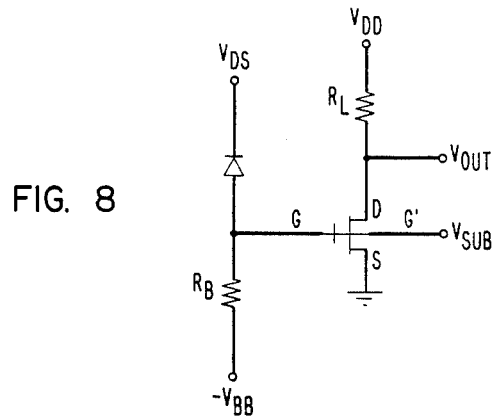
FIG. 8 shows a typical circuit making use of the JFET structure and PINFET structure.

FIG. 8 shows a typical circuit unit in which the invention would often be used. Here, $R_B$ is a bias resistance and $R_L$ a load resistance of the circuit.

In most circuit applications, the resistors ($R_B$ and $R_L$) are usually made in the form of FETS appropriately biased and placed in the semiconductor structure to produce the desired characteristics. Generally, the load resistance is produced by a JFET structure close to identical to the JFET structures described above so as to minimize capacitance and produce good electrical characteristics even when doping profile is not optimum. Often, such a FET has the gate electrode connected to the source electrode. The bias resistance is also usually supplied by a FET structure but not necessarily a structure as described above and has a large gate length compared to the JFETS described above.

Figure 9:
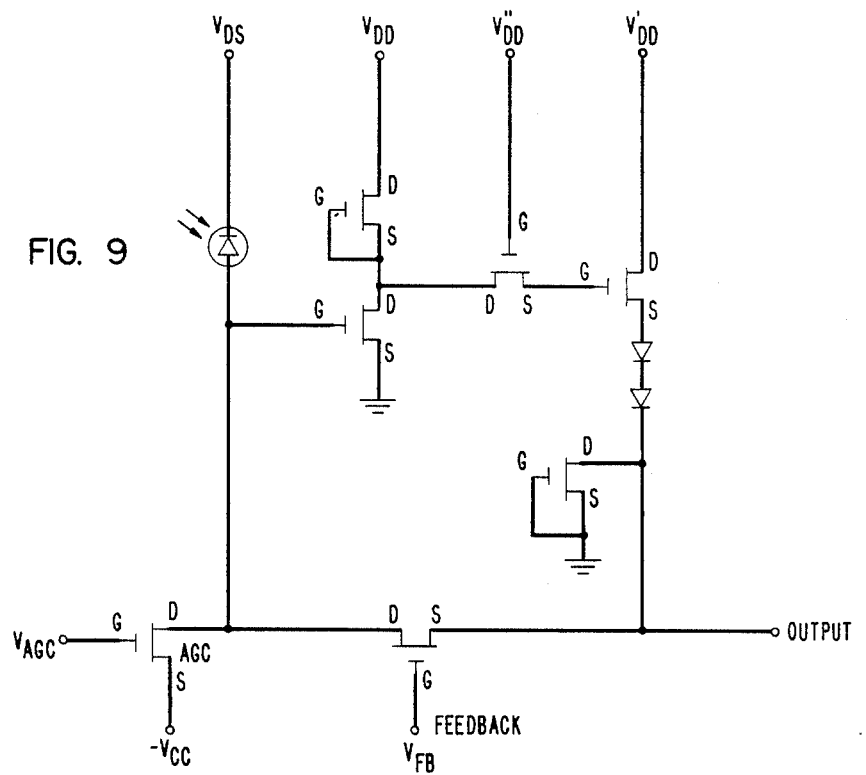
FIG. 9 shows a typical optical-electronic circuit with photodetector, JFET and cascode stage.

More complex circuits are also useful in the practice of the invention. FIG. 9 shows a typical transimpedance optical receiver circuit, including cascode stage useful in the practice of the invention.

What is claimed is:

1. A semiconductor device comprising at least one PINFET structure, said PINFET structure comprising:
    a. first region comprising n-type III-V semiconductor compound;
    b. second epitaxial region comprising intrinsic III-V semiconductor compound, said second epitaxial layer contacting at least a portion of the first region;
    c. third epitaxial region comprising III-V semiconductor compound, said third epitaxial region contacting at least a portion of the second epitaxial region;
    d. a JFET portion of the PINFET structure comprising fourth epitaxial region comprising III-V semiconductor compound with n-type conductivity, said fourth epitaxial region contacting at least a portion of the third epitaxial region;
    e. fifth epitaxial region comprising III-V semiconductor compound with p-type conductivity and contacting at least a portion of the fourth epitaxial region, said fifth epitaxial region having a length;
    f. source and drain electrodes, said source and drain electrodes contacting said fourth epitaxial region;
    g. gate electrode contacting said fifth epitaxial region and having a length, the length and position of the gate electrode relative to the fifth epitaxial region being such that it overhangs the fifth epitaxial region;
    h. a PIN portion of the PINFET structure comprising a sixth epitaxial region comprising III-V semiconductor compound with n-type conductivity, said sixth epitaxial region contacting at least a portion of the third epitaxial region but not contacting the fourth or fifth epitaxial regions;
    i. seventh epitaxial region comprising III-V semiconductor compound with p-type conductivity contacting at least a portion of the sixth epitaxial region but not contacting the fourth or fifth epitaxial regions;
    j. a p-contact comprising conductive material contacting at least a portion of a highly doped p-type region that extends from under the p-contact through the seventh epitaxial region, through the sixth epitaxial region and partially into the portion of the third epitaxial region under the p-contact;
    k. means for electrically connecting the p-contact to the gate electrode characterized in that the third epitaxial region comprises p-type III-V semiconductor compounds; and a back gate electrode is contacted to the third epitaxial layer.

2. The semiconductor device of claim 1 in which the p-contact electrically contacts the third epitaxial region through the sixth and seventh epitaxial regions.

3. The semiconductor device of claim 1 in which the length of the gate electrode is less than or equal to the distance between source and drain electrodes.

4. The semiconductor device of claim 1 in which the length of the fifth epitaxial region measured along its interface with the fourth epitaxial region is less than the length of the gate electrode.

5. The semiconductor device of claim 4 in which the first region is a substrate of n-type InP and the second, third, fourth, fifth, sixth and seventh epitaxial regions are III-V semiconductor compounds with compositions that are lattice-matched to InP.

6. The semiconductor device of claim 5 in which the III-V semiconductor compound of the second epitaxial layer is intrinsic InGaAs with composition such that the InGaAs is approximately lattice-matched to InP.

7. The semiconductor device of claim 6 in which the third epitaxial layer is undoped InAlAs with composition so that the InAlAs is lattice-matched to InP.

8. The semiconductor device of claim 6 in which the third epitaxial layer is semi-insulating InP.

9. The semiconductor device of claim 8 in which the semi-insulating InP is Fe doped InP deposited by metallo-organic chemical vapor deposition.

10. The semiconductor device of claim 1 in which the fourth and sixth epitaxial regions and the fifth and seventh epitaxial regions comprise the same III-V semiconductor compound.

11. The semiconductor device of claim 10 in which the fourth and sixth epitaxial regions comprises n-type InP and the fifth and seventh epitaxial regions comprise p-type InP.

12. The semiconductor device of claim 11 in which the n-type InP is doped with an element selected from the group consisting of tin, silicon, sulphur and tellurium.

13. The semiconductor device of claim 11 in which the p-type InP is doped with an element selected from the group consisting of cadmium, zinc, magnesium and beryllium.

14. The semiconductor device of claim 11 in which the fourth and sixth epitaxial region is n-type InGaAs and the fifth and seventh epitaxial region is p-type InP.

15. The semiconductor device of claim 10 in which the fourth and sixth epitaxial regions comprise different III-V semiconductor compounds from the fifth and seventh epitaxial regions.

16. The semiconductor device of claim 15 in which the fourth and sixth epitaxial regions comprise n-type InP and the fifth and seventh epitaxial regions comprise p-type InGaAs.

17. The semiconductor device of claim 15 in which the fourth and sixth epitaxial regions comprise n-type InGaAs and the fifth and seventh epitaxial regions comprise p-type InP.

18. The semiconductor device of claim 1 in which the electrical connection between the p-contact and the gate electrode comprise an air bridge so that sixth and seventh epitaxial regions do not electrically contact the fourth and fifth epitaxial regions.

19. The semiconductor device of claim 1 in which the source electrode and drain electrode are within 2 $\mu$m of the fifth epitaxial region.

20. The semiconductor device of claim 19 in which the source electrode and drain electrode are within 1 $\mu$m of the fifth epitaxial region.

21. The semiconductor device of claim 1 in which the length of the fifth epitaxial region is less than 5 $\mu$m.

22. The semiconductor device of claim 1 in which the overhang of the gate electrode over the fifth epitaxial region is between 0.3 and 1.0 $\mu$m.

23. The semiconductor device of claim 1 in which the thickness of the fourth epitaxial region is less than 1 $\mu$m.

24. The semiconductor device of claim 1 in which the thickness of the fifth epitaxial region is less than 1 $\mu$m.

25. The semiconductor device of claim 1 in which a double gate electrode is used with the drain electrode substantially between the two gate electrodes.

* * * * *